April 4, 1967
R. L. DURRETT
3,312,833
AMPLIFIER PARALLEL CONNECTED CATHODE FOLLOWER OUTPUT STAGE
Filed June 26, 1963
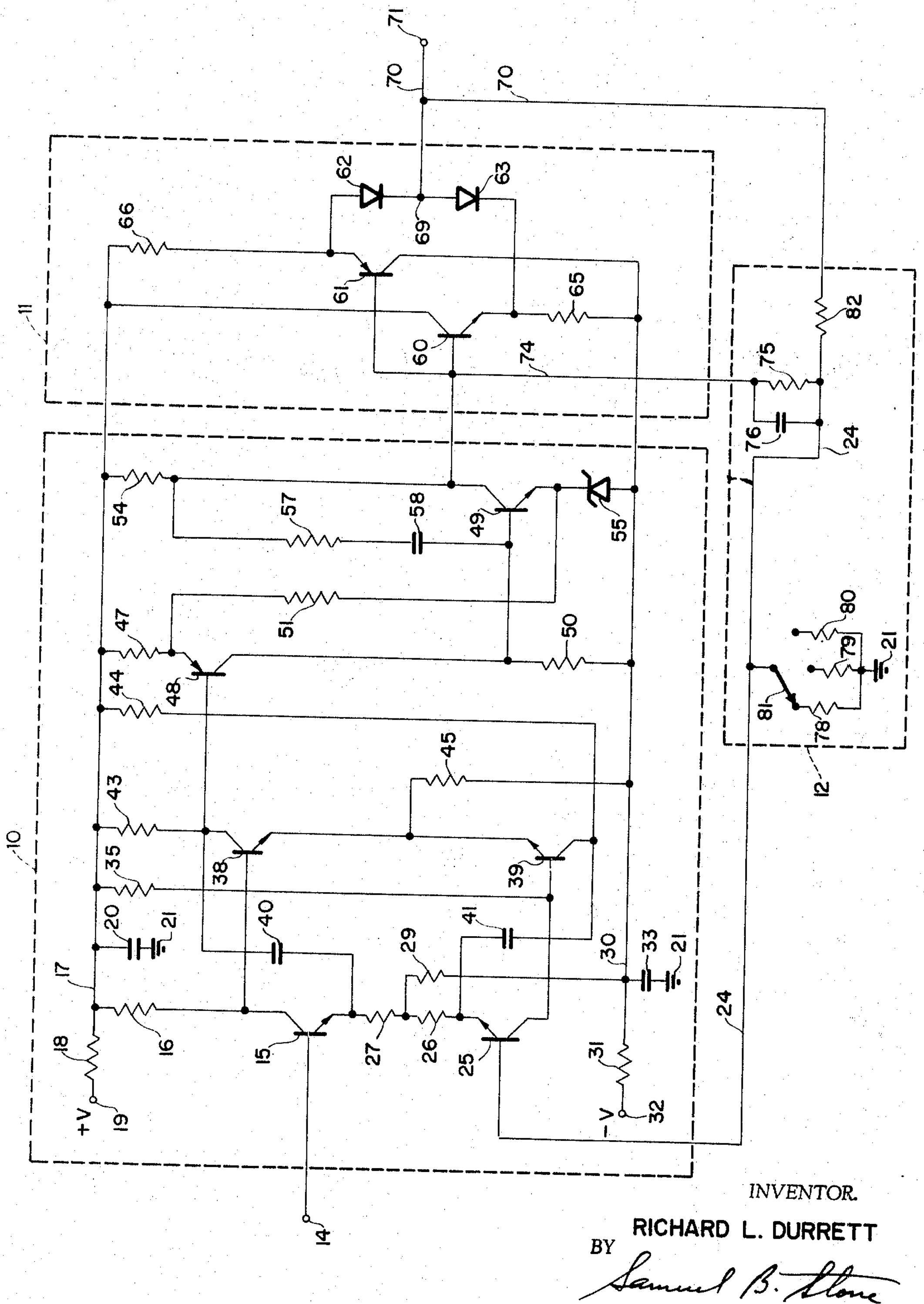
INVENTOR.
RICHARD L. DURRETT
BY Samuel B. Stone
ATTORNEY 3,312,833
AMPLIFIER PARALLEL CONNECTED CATHODE FOLLOWER OUTPUT STAGE Richard L. Durrett, Los Angeles, Calif., assignor to Beckman Instruments, Inc., a corporation of California Filed June 26, 1963, Ser. No. 290,789
5 Claims. (Cl. 307—88.5)

This invention relates to electrical signal amplifiers and more particularly to a current limiting output stage therefor having a low output impedance for loads below a limiting value.

In many instances it is desirable to provide an amplifier which provides a low output impedance for loads below a particular limiting value, and in which the output may be short circuited without overloading the input thereof. One typical application for such an amplifier is the preamplification stage of a wide-band low pass pulse amplifier such as that described in co-pending U.S. Patent 3,249,883 entitled, "A.C. Coupled Pulse Amplifier With Floating Input and Grounded Output" filed concurrently herewith by R. H. Berneike et al. and assigned to the assignee of the present invention. The pulse amplifier described in said copending application is an amplifier which provides precision amplification of pulse signals having a frequency range from zero to a high frequency. The pulse amplifier includes a storage element in the form of a capacitor which stores an offset voltage upon command equal to the input voltage present. The offset voltage stored is thus subsequently subtracted from an input signal applied to the pulse amplifier so that the output signal thereof is an exact replica of the input signal. In such an application, a preamplifier and a post amplifier are employed with the storage capacitor connected in series between the two amplifiers. In addition to the necessity of providing current limiting, a low output impedance is necessary for the rapid charging of the capacitor. Additionally, when such a pulse amplifier is utilized in a high speed high accuracy data handling system it is desirable to eliminate any storage elements from the current limiting output stage of the preamplifier in order to allow fast recovery from any overloads.

According to a feature of the present invention, a current limiting output stage for an amplifier is provided which exhibits a low output impedance below a limiting value, and which is of improved and simplified design.

An additional feature of the present invention is the provision of a current limiting output stage for an amplifier, which limiting stage provides a low output impedance below a particular limiting value and which includes no storage elements which cause slow recovery from overloads.

In a specific exemplary embodiment of a current limiting output stage for an amplifier, NPN and PNP transistors connected as emitter-followers in parallel are coupled to an output load by diodes to allow current limiting in both positive and negative directions. The circuit is simple in construction and includes no storage elements such as inductances and capacitances which cause slow recovery from overloads. Through the unique circuit concepts, the current limiting output stage provides low output impedance for loads below a limiting value and the output may be short circuited without loading the input. Thus any overloads appearing at the output are efficiently decoupled from an amplifier driver stage connected to the current limiting output stage.

Other features and objects of the invention will be better understood from a consideration of the following detailed description when read in conjunction with the attached drawing which illustrates an amplifier having a current limiting output stage coupled therewith constructed in accordance with the teachings of the present invention.

Referring now to the drawing, a transistorized amplifier having a novel current limiting output stage coupled thereto is illustrated. The over-all amplifier shown in the drawing includes a plurality of amplification stages shown within a dashed line box 10, a current limiting output stage shown within a dashed line box 11, and a feedback network shown within a dashed line box 12. The amplifier shown within the box 10 includes two differential stages and two single-ended stages. An input terminal 14 is connected to the base of an NPN transistor 15. The collector of the transistor 15 is connected through a load resistance 16 to a positive voltage bus 17. The positive voltage bus 17 is connected through a resistance 18 to a positive voltage terminal 19. The bus 17 also is connected through a filter capacitor 20 to ground 21.

A feedback line 24 from the feedback network 12 is connected to the base of an NPN transistor 25. The emitter of the transistor 25 is connected through a pair of resistances 26 and 27 to the emitter of the transistor 15. The juncture of the resistances 26 and 27 is connected through a resistance 29 to a negative voltage bus 30. The negative voltage bus is connected through a resistance 31 to a negative voltage terminal 32. The negative voltage bus 30 also is connected through a filter capacitor 33 to ground 21. The collector of the transistor 25 is connected through a load resistance 35 to the positive voltage bus 17. The transistors 15 and 25 function as a differential input stage and the output of this stage is connected to a second differential stage including a pair of NPN transistors 38 and 39. The collector of the transistor 15 is connected to the base of the transistor 38, and the collector of the transistor 25 is connected to the base of the transistor 39. A capacitor 40 is connected between the emitter of the transistor 15 and the collector of the transistor 38, and a capacitor 41 is similarly connected between the emitter of the transistor 25 and the collector of the transistor 39. The collectors of the transistors 38 and 39 are connected through respective load resistances 43 and 44 to the positive voltage bus 17. The emitters of the transistors 38 and 39 are connected together and are connected through a resistance 45 to the negative voltage bus 30.

The output of the differential stage including the transistors 38 and 39 is connected to two successive single-ended stages including a PNP transistor 48 and an NPN transistor 49. The collector of the transistor 38 is connected to the base of the transistor 48. The emitter of the transistor 48 is connected through a load resistance 47 to the positive voltage line 17. The collector of this transistor is connected through a resistance 50 to the negative voltage line 30. The collector of this transistor also is connected to the base of the transistor 49. The emitter of the transistor 48 is connected through a resistance 51 to the emitter of the transistor 49. The collector of the transistor 49 is connected through a load resistance 54 to the positive voltage line 17, and the emitter thereof is connected through a zener diode 55 to the negative voltage line 30. A resistance 57 and a capacitor 58 are connected in series between the collector and the base of the transistor 49. The zener diode 55 functions to provide a predetermined collector voltage level for the transistor 49, and to provide a low impedance for the emitter of the transistor 49.

According to a feature of the present invention, a current limiting stage is connected to the amplifier shown in the drawing, and this current limiting stage includes an NPN transistor 60, a PNP transistor 61 and a pair of diodes 62 and 63. The collector of the transistor 49 is connected to the base of the transistor 60. The collector of the transistor 60 is connected to the positive voltage line 17, and the emitter thereof is connected through a resistance 65 to the negative voltage line 30. The collector of the transistor 49 also is connected to the base of the transistor 61. The emitter of the transistor 61 is connected through a resistance 66 to the positive voltage line 17, and the collector thereof is connected directly to the negative voltage line 30. The diodes 62 and 63 are connected in series across the emitters of the transistors 60 and 61. A juncture 69 of the diodes 62 and 63 is connected to an output line 70 which in turn is connected to an output terminal 71. Thus, the transistors 60 and 61 are connected as emitter-followers in parallel and are connected with the output terminal 71 by the diodes 62 and 63 so that current limiting occurs in both the positive and negative directions. This arrangement provides a low output impedance for loads below the limiting value, and the output may be short circuited without loading the driving stages. The output stage thus decouples any overloads from the driver, and no storage elements, such as inductances and capacitances, are employed which cause slow recovery from overloads.

Feedback is provided around the driver stages of the amplifier shown in the drawing by means of the feedback network 12. A line 74 is connected from the collector of the transistor 49 to a resistance 75 and a capacitance 76 connected in parallel. The resistance 75 and capacitance 76 are in turn connected to the feedback line 24 which is connected to the base of the transistor 25 in the input differential stage. Feedback attenuation is provided by resistances 78, 79 and 80, one terminal of each being connected to ground 21. The remaining terminals of the resistances 78 through 80 are arranged to be contacted by switch arm 81 which is connected to the feedback line 24.

Additional feedback is provided through the output line 70 and through a resistance 82 to the line 24 in the feedback network 12. This additional feedback connection further lowers the output impedance of the amplifier shown in the drawing. A typical output impedance may be approximately 10 ohms. The two feedback lines 70 and 74 provide split feedback when the amplifier shown in the drawing is functioning as a differential amplifier. In the event the output terminal 71 is tied to ground, which periodically occurs when it is used in the "pulse amplifier" described in the aforementioned Hinrichs et al. application, no feedback is provided by the line 70 to the feedback network 12.

Germanium diodes and transistors or silicon diodes and transistors have been found suitable in the current limiting output stage of the present invention. In order to prevent zero cross-over distortion, the $V_{eb}$ of the transistors should match the voltage drop across the diodes. The resistances 65 and 66 determine the maximum load current. Resistances also may be connected between the collector of the transistor 60 and the positive voltage line 17, and between the collector of the transistor 61 and the negative voltage line 30 to limit the power dissipation in the respective transistors, if desired. Furthermore, a variable resistance may be connected between the bases of the transistors 60 and 61 in order to provide adjustment of the bias current through the diodes 62 and 63 to thereby further minimize the output impedance of the output stage. The maximum output of the current limiting output stage is dependent on the voltage at which limiting occurs. The current limit may be made independent of the output voltage by replacing the resistances 65 and 66 by current sources.

It now should be apparent that the present invention provides a current limited output stage which provides a low output impedance for loads below a particular limiting value. The circuit employs complementary emitter-followers and diodes such that the current is limited in both the positive and negative directions. The output of the circuit may be severely loaded without loading the input, and thus the circuit decouples overloads from driver stages. No storage elements are employed and hence the overload stage has a rapid recovery from any overloads.

Although an exemplary embodiment of the present invention has been disclosed and discussed, it will be understood that other applications and circuit arrangements are possible and that the embodiment disclosed may be subjected to various changes, modifications and substitutions without necessarily departing from the spirit of the invention.

What is claimed is:

1. A current limiting output stage for use with an amplifier comprising
   - first and second transistors of opposite conductivity types, each of said transistors including a base, an emitter and collector electrodes,
   - first and second diodes,
   - input and output terminals,
   - first and second voltage terminals adapted to be connected to sources of voltage,
   - means connecting said input terminal with the bases of said first and second transistors for applying input signals thereto,
   - means connecting the collector electrode of said first transistor and the emitter electrode of said second transistor with said first voltage terminal for supplying voltage to said respective collector and emitter electrodes thereof,
   - means connecting said emitter electrode of said first transistor and said collector electrode of said second transistor with said second voltage terminal for supplying voltage to the respective emitter and collector electrodes thereof,
   - a common terminal,
   - said first and second diodes being connected in series and poled in a like direction between the emitter electrode of said second transistor and the emitter electrode of said first transistor, with said common terminal being connected between said diodes, and
   - said output terminal being connected to said common terminal.

2. A device as defined in claim 1 further including
   - a driver amplifier stage including an input terminal and an output terminal,
   - a feedback network including an input terminal and an output terminal,
   - means connecting said output terminal of said driver amplifier stage with said input terminal of said current limiting output stage and with said input terminal of said feedback network,
   - means connecting the output terminal of said feedback network with the input terminal of said driver amplifier stage, and
   - means connecting said output terminal of said current limiting output stage with said input terminal of said feedback network whereby feedback is provided to the input of said feedback network from the output of said driver amplifier stage and from the output of said current limiting output stage when the output of said driver amplifier stage is below a predetermined magnitude, and no feedback is provided from the output of said current limiting output stage when said output of said driver amplifier stage is above said predetermined magnitude.

3. A current limiting output stage for use with an electrical signal amplifier comprising
   - a pair of complementary transistors connected as emitter followers in parallel, said complementary transistors including an NPN type transistor and a PNP type transistor with each of said transistors including first, second and third electrodes,
   - an input terminal connected to the first electrodes of said transistors,
   - first and second diodes, means connecting said first and second diodes in series between the second electrodes of said transistors, said diodes being poled in a like direction, and an output terminal, said output terminal being connected between said diodes.

4. An electrical signal amplifier comprising a driver amplifier, an output stage, and a feedback network, the output of said driver amplifier being coupled with the input of said output stage and with the input of said feedback network, and the output of said feedback network being connected as an input to said driver amplifier, means for applying input signals to said driver amplifier for amplification thereby, the improvement comprising said output stage including complementary transistors connected as emitter followers in parallel, a pair of diodes connected in series and poled in a like direction and connected between like electrodes of said respective transistors, the input of said output stage being connected to other respective like electrodes of said transistors and the output of said output stage being connected between said diodes, and means connecting the output of said output stage with the input of said feedback network.

5. A current limiting output stage for use with an electrical amplifier comprising an NPN and a PNP transistor, each including first, second and third electrodes, first and second voltage terminals, an input terminal and an output terminal, first and second diodes, a conductor coupled between said input terminal and the first electrodes of said transistors, means connected between the second electrode of said first transistor and said first voltage terminal, and means connected between the second electrode of said second transistor and said second voltage terminal, an impedance connected between the third electrode of said first transistor and said second voltage terminal, and an impedance connected between the third electrode of said second transistor and said first voltage terminal, electrical conductors connecting said diodes in series between the third electrodes of said transistors, and a conductor coupled between said diodes and said output terminals.

References Cited by the Examiner

UNITED STATES PATENTS

| | | | |
|---|---|---|---|
| 2,999,925 | 9/1961 | Thomas | 328—171 X |
| 3,064,141 | 11/1962 | Chou | 307—88.5 |
| 3,172,051 | 3/1965 | Baron et al. | 307—88.5 X |

ARTHUR GAUSS, *Primary Examiner.*

J. JORDAN, *Assistant Examiner.*